United States Patent
Xu et al.

(10) Patent No.: US 9,275,917 B2
(45) Date of Patent: Mar. 1, 2016

(54) DETERMINATION OF GAIN FOR EDDY CURRENT SENSOR

(71) Applicant: Applied Materials, Inc., Santa Clara, CA (US)

(72) Inventors: Kun Xu, Sunol, CA (US); Shih-Haur Shen, Sunnyvale, CA (US); Boguslaw A. Swedek, Cupertino, CA (US); Ingemar Carlsson, Milpitas, CA (US); Doyle E. Bennett, Santa Clara, CA (US); Wen-Chiang Tu, Mountain View, CA (US); Hassan G. Iravani, San Jose, CA (US); Tzu-Yu Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 63 days.

(21) Appl. No.: 14/066,509

(22) Filed: Oct. 29, 2013

(65) Prior Publication Data
US 2015/0118765 A1  Apr. 30, 2015

(51) Int. Cl.
*H01L 21/66* (2006.01)
*H01L 21/321* (2006.01)
(Continued)

(52) U.S. Cl.
CPC .............. *H01L 22/26* (2013.01); *B24B 37/013* (2013.01); *B24B 49/105* (2013.01); *H01L 21/3212* (2013.01)

(58) Field of Classification Search
CPC . H01L 21/02579; H01L 21/20; H01L 21/265; H01L 21/425; H01L 21/26506; H01L 21/36; H01L 22/26; H01L 21/3212; B24B 37/013; B24B 49/105
See application file for complete search history.

(56) References Cited

U.S. PATENT DOCUMENTS

| 6,924,641 | B1   | 8/2005 | Hanawa et al. |
| 6,939,198 | B1 * | 9/2005 | Swedek ............. B24B 37/013 451/41 |
| 7,016,795 | B2   | 3/2006 | Swedek et al. |

(Continued)

FOREIGN PATENT DOCUMENTS

| JP | 2009-099842 | 5/2009 |
| JP | 2011-023579 | 2/2011 |

(Continued)

OTHER PUBLICATIONS

International Search Report and Written Opinion in International Application No. PCT/US2014/062699, mailed Jan. 28, 2015, 11 pages.

*Primary Examiner* — Kyoung Lee
(74) *Attorney, Agent, or Firm* — Fish & Richardson P.C.

(57) ABSTRACT

In one aspect, a method of controlling polishing includes receiving a measurement of an initial thickness of a conductive film on a first substrate prior to polishing the first substrate from an in-line or stand-alone monitoring system, polishing one or more substrates in a polishing system, the one or more substrates including the first substrate, during polishing of the one or more substrates, monitoring the one or more substrates with an eddy current monitoring system to generate a first signal, determining a starting value of the first signal for a start of polishing of the first substrate, determining a gain based on the starting value and the measurement of the initial thickness, for at least a portion of the first signal collected during polishing of at least one substrate of the one or more substrates, and calculating a second signal based on the first signal and the gain.

16 Claims, 6 Drawing Sheets

(51) Int. Cl.
*B24B 37/013* (2012.01)
*B24B 49/10* (2006.01)

(56) References Cited

U.S. PATENT DOCUMENTS

| | | |
|---|---|---|
| 7,112,960 B2 | 9/2006 | Miller et al. |
| 2007/0103150 A1 | 5/2007 | Tada et al. |
| 2007/0251922 A1 | 11/2007 | Swedek et al. |
| 2009/0104847 A1 | 4/2009 | Kobayashi et al. |
| 2009/0156098 A1 | 6/2009 | Swedek et al. |
| 2010/0099334 A1 | 4/2010 | Bennett et al. |
| 2011/0124269 A1 | 5/2011 | Tada et al. |
| 2011/0318992 A1 | 12/2011 | David et al. |

FOREIGN PATENT DOCUMENTS

| | | |
|---|---|---|
| WO | WO 97/21070 | 6/1997 |
| WO | WO 01/46684 | 6/1999 |
| WO | WO 2004/059242 | 7/2004 |

* cited by examiner

DETERMINATION OF GAIN FOR EDDY CURRENT SENSOR

TECHNICAL FIELD

The present disclosure relates to chemical mechanical polishing and more specifically to monitoring of a conductive layer during chemical mechanical polishing.

BACKGROUND

An integrated circuit is typically formed on a substrate by the sequential deposition of conductive, semiconductive, or insulative layers on a silicon wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines provide conductive paths between thin film circuits on the substrate.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. Polishing slurry with abrasive particles is typically supplied to the surface of the polishing pad.

One problem in CMP is determining whether the polishing process is complete, i.e., whether a substrate layer has been planarized to a desired flatness or thickness, or when a desired amount of material has been removed. Variations in the slurry composition, the polishing pad condition, the relative speed between the polishing pad and the substrate, the initial thickness of the substrate layer, and the load on the substrate can cause variations in the material removal rate. These variations cause variations in the time needed to reach the polishing endpoint. Therefore, determining the polishing endpoint merely as a function of polishing time can lead to non-uniformity within a wafer or from wafer to wafer.

In some systems, a substrate is monitored in-situ during polishing, e.g., through the polishing pad. One monitoring technique is to induce an eddy current in the conductive layer and detect the change in the eddy current as the conductive layer is removed.

SUMMARY

In one aspect, a method of controlling polishing includes receiving a measurement of an initial thickness of a conductive film on a first substrate prior to polishing the first substrate from an in-line or stand-alone monitoring system, polishing one or more substrates in a polishing system, the one or more substrates including the first substrate, during polishing of the one or more substrates, monitoring the one or more substrates with an eddy current monitoring system to generate a first signal, determining a starting value of the first signal for a start of polishing of the first substrate, determining a gain based on the starting value and the measurement of the initial thickness, for at least a portion of the first signal collected during polishing of at least one substrate of the one or more substrates, calculating a second signal based on the first signal and the gain, and determining at least one of a polishing endpoint or an adjustment to a polishing parameter for the at least one of the substrate based on the second signal.

Implementations may include one or more of the following features.

Calculating the second signal may include multiplying by the gain.

Calculating the second signal may include calculating V'=V*G+K wherein V' is the second signal, V is the first signal, G is the gain and K is an offset.

The at least one substrate of the one or more substrates may be the first substrate.

The at least one substrate of the one or more substrates may be a second substrate polished subsequent to the first substrate.

The polishing system may include a rotatable platen, and an eddy current sensor of the eddy current monitoring system is supported on the platen to sweep across the one or more substrates.

The first signal may be generated from a portion of a signal generated when the eddy current sensor is not adjacent the substrate.

A reference value may be determined from a portion of the signal generated when the eddy current sensor is not adjacent the substrate.

An offset may be generated by adjusting the reference value to generate a desired value for zero thickness.

Determining the gain may include determining a desired value from a calibration function relating thickness to signal strength and the measurement of the initial thickness.

Determining the gain may include calculating a multiplier N according to $$N = \frac{(D-K)}{(S-K)}$$

where D is the desired value, S is the starting value, and K is a constant representing a value of the calibration function for zero thickness.

Determining the gain may include multiplying an old gain by N.

Determining the starting value may include generating a sequence of measured values from the first signal, fitting a function to the sequence of measured values, and calculating the starting value as a value of the function at an approximate start time of the polishing operation.

In another aspect, a computer program product, tangibly encoded on a non-transitory computer readable media, includes instructions operable to cause a data processing apparatus to perform operations to carry out any of the above methods.

In another aspect, a polishing system includes a rotatable platen to support a polishing pad, a carrier head to hold a first substrate against the polishing pad, an in-situ eddy current monitoring system including a sensor to generate a first signal depending on a thickness of a conductive layer on the substrate, and a controller configured carry out any of the above methods.

In another aspect, a method of controlling polishing includes polishing a substrate at a first polishing station, during polishing of the substrate at the first polishing station, monitoring the substrate with a first eddy current monitoring system to generate a first signal, determining an ending value of the first signal for an end of polishing of the substrate at the first polishing station, determining a first temperature at the first polishing station, after polishing the substrate at the first polishing station, polishing the substrate at a second polishing station, during polishing of the substrate at the second polishing station, monitoring the substrate with a second eddy current monitoring system to generate a second signal, determining a starting value of the second signal for a start of polishing of the substrate at the second polishing station, determining a gain for the second polishing station based on the ending value, the starting value and the first temperature, for at least a portion of the second signal collected during polishing of at least one substrate at the second polishing station, calculating a third signal based on the second signal and the gain, and determining at least one of a polishing endpoint or an adjustment to a polishing parameter for the at least one substrate based on the third signal.

Implementations may include one or more of the following features.

Determining the gain for the second polishing station may further includes measuring a second temperature at the second polishing station.

The gain may be calculated based on the resistivity of a layer being polished at first and second temperatures.

[1+alpha ($TE_{post}$–$TE_{ini}$)] may be calculated, where $TE_{post}$ is the first temperature at the first polishing pad, $TE_{ini}$ is the second temperature at the second polishing pad, and alpha is a resistivity factor for a material of layer being polished.

An ending value of the first signal for an end of polishing of the substrate at the first polishing station may be determined.

Determining the ending value may include generating a first sequence of measured values from the first signal, fitting a first function to the first sequence of measured values, and calculating the ending value as a value of the function at an endpoint time for polishing at the first polishing station.

A first thickness may be determined from the ending value and a calibration function relating thickness to signal strength.

An adjusted thickness may be determined based on the first thickness, the first temperature and the second temperature.

Determining the adjusted thickness may include multiplying the first thickness by [1+alpha ($TE_{post}$–$TE_{ini}$)] where $TE_{post}$ is the first temperature at the first polishing pad, $TE_{ini}$ is the second temperature at the second polishing pad, and alpha is a resistivity factor for a material of layer being polished.

A desired value may be determined from the adjusted value and the calibration function.

A starting value of the second signal for a start of polishing of the substrate at the second polishing station may be determined.

Determining the starting value may include generating a second sequence of measured values from the second signal, fitting a second function to the second sequence of measured values, and calculating the starting value as a value of the second function at an approximate start time of polishing at the second polishing station.

Determining the gain may include calculating a multiplier N according to $$N = \frac{(D-K)}{(S-K)}$$

where D is the desired value, S is the starting value, and K is a constant representing a value of the calibration function for zero thickness.

The first temperature may be a temperature of a first polishing pad at the first polishing station and the second temperature may be a temperature of a second polishing pad at the second polishing station.

The first temperature may be a temperature of a layer being polished at the first polishing station and the second temperature may be a temperature of the layer being polished at the second polishing station.

In another aspect, a computer program product, tangibly encoded on a non-transitory computer readable media, operable to cause a data processing apparatus to perform operations to carry out any of the above methods.

In another aspect, a polishing system include a first polishing station including a first platen to support a first polishing pad, a first in-situ eddy current monitoring system including a first sensor to generate a first signal depending on a thickness of a conductive layer on a substrate, and a first temperature sensor, a second polishing station including a second platen to support a second polishing pad and a second in-situ eddy current monitoring system including a second sensor to generate a second signal depending on the thickness of the conductive layer on the substrate, a carrier head to hold the substrate, and a controller configured carry out any of the above methods.

Implementations may include one or more of the following advantages. Gain and offset of the monitoring system can be adjusted automatically to compensate for the parameters that can affect the eddy current signal. For example gain and offset can be adjusted for changes in the environmental conditions (e.g., temperature) or equipment parameters such as the thickness of the polishing pad. Reliability of the endpoint system to detect a desired polishing endpoint can be improved, and within-wafer and wafer-to-wafer thickness non-uniformity can be reduced.

The details of one or more implementations are set forth in the accompanying drawings and the description below. Other aspects, features, and advantages will be apparent from the description and drawings, and from the claims.

BRIEF DESCRIPTION OF THE DRAWINGS

Like reference numbers and designations in the various drawings indicate like elements.

DETAILED DESCRIPTION

One monitoring technique for controlling a polishing operation is to use an alternating current (AC) drive signal to induce eddy currents in a conductive layer on a substrate. The induced eddy currents can be measured by an eddy current sensor in-situ during polishing to generate a signal. Assuming the outermost layer undergoing polishing is a conductive layer, then the signal from the sensor should be dependent on the thickness of the layer.

Different implementations of eddy current monitoring systems may use different aspects of the signal obtained from the sensor. For example, the amplitude of the signal can be a function of the thickness of the conductive layer being polished. Additionally, a phase difference between the AC drive signal and the signal from the sensor can be a function of the thickness of the conductive layer being polished.

Due to composition and assembly variations, eddy current sensors can exhibit different gains and offsets when measuring the eddy current. The eddy current can also be affected by variations in the environmental parameters, e.g., the temperature of the substrate during polishing. Run time variations such as pad wear or variations of the pressure exerted on the polishing pad (e.g., in an in-situ monitoring system) can change the distance between the eddy current sensor and the substrate and can also affect the measured eddy current signal. Therefore, calibration of the eddy current monitoring system may be performed to compensate for these variations.

Figure 1:
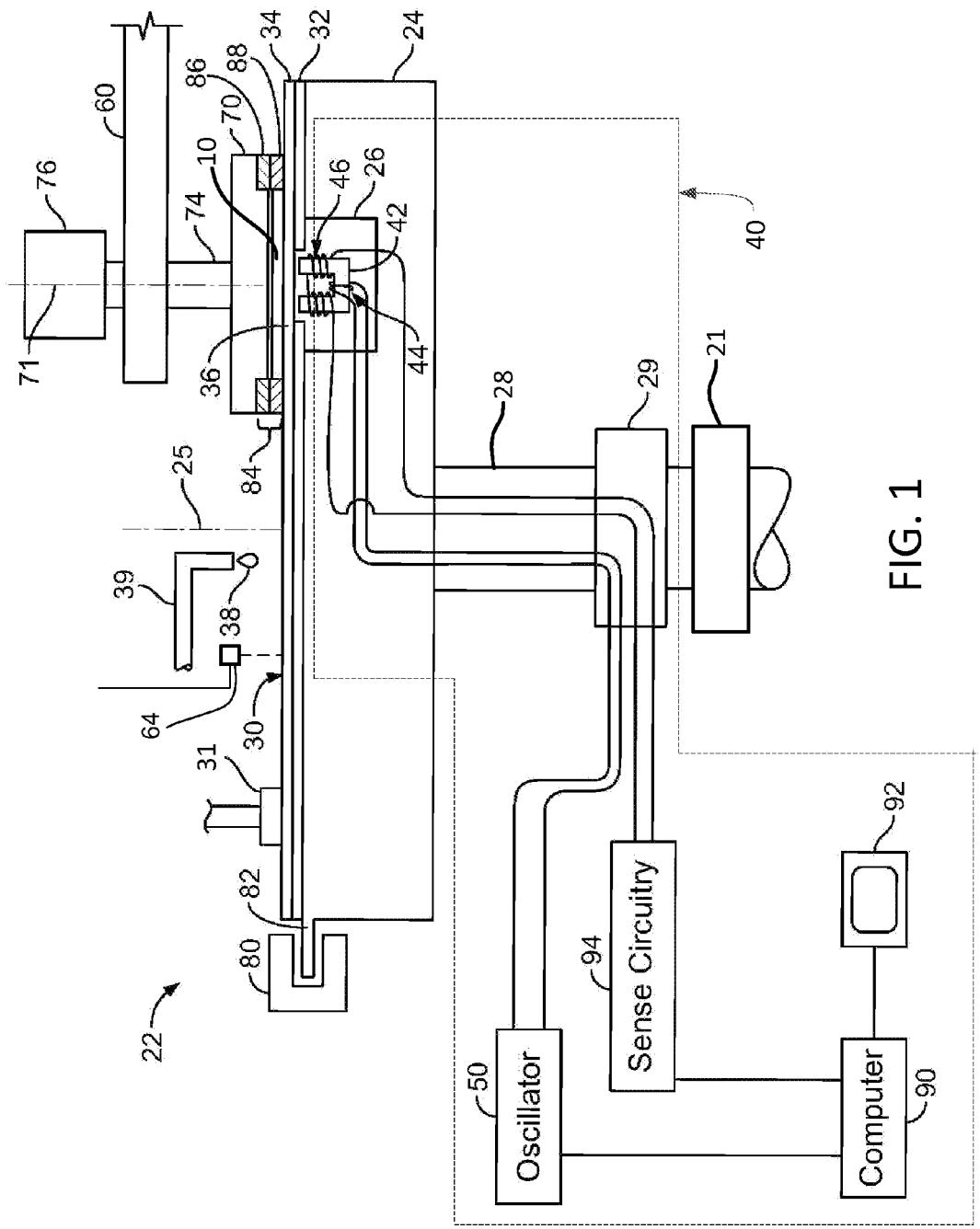
FIG. 1 illustrates a cross-sectional view of an example of a polishing station including an eddy current monitoring system.

FIG. 1 illustrates an example of a polishing station 22 of a chemical mechanical polishing apparatus. The polishing station 22 includes a rotatable disk-shaped platen 24 on which a polishing pad 30 is situated. The platen 24 is operable to rotate about an axis 25. For example, a motor 21 can turn a drive shaft 28 to rotate the platen 24. The polishing pad 30 can be a two-layer polishing pad with an outer layer 34 and a softer backing layer 32.

The polishing station 22 can include a supply port or a combined supply-rinse arm 39 to dispense polishing liquid 38, such as slurry, onto the polishing pad 30.

The carrier head 70 is operable to hold a substrate 10 against the polishing pad 30. The carrier head 70 is suspended from a support structure 60, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel or track 60; or by rotational oscillation of the carousel itself. In operation, the platen is rotated about its central axis 25, and the carrier head is rotated about its central axis 71 and translated laterally across the top surface of the polishing pad 30. Where there are multiple carrier heads, each carrier head 70 can have independent control of its polishing parameters, for example each carrier head can independently control the pressure applied to each respective substrate.

The carrier head 70 can include a retaining ring 84 to hold the substrate. In some implementations, the retaining ring 84 may include a highly conductive portion, e.g., the carrier ring can include a thin lower plastic portion 86 that contacts the polishing pad, and a thick upper conductive portion 88. In some implementations, the highly conductive portion is a metal, e.g., the same metal as the layer being polished, e.g., copper.

A recess 26 is formed in the platen 24, and a thin section 36 can be formed in the polishing pad 30 overlying the recess 26. The recess 26 and thin pad section 36 can be positioned such that regardless of the translational position of the carrier head they pass beneath substrate 10 during a portion of the platen rotation. Assuming that the polishing pad 30 is a two-layer pad, the thin pad section 36 can be constructed by removing a portion of the backing layer 32.

The polishing station 22 can include a pad conditioner apparatus with a conditioning disk 31 to maintain the condition of the polishing pad.

In some implementations, the polishing station 22 includes a temperature sensor 64 to monitor a temperature in the system. Although illustrated in FIG. 1 as positioned to monitor the temperature of the polishing pad 30 and/or slurry 38 on the pad 30, the temperature sensor 64 could be positioned inside the carrier head to measure the temperature of the substrate 10.

The polishing station may include an in-situ monitoring system 40. The in-situ monitoring system 40 generates a time-varying sequence of values that depend on the thickness of a layer on the substrate 10. In particular, the in-situ monitoring system 40 can be an eddy current monitoring system. Similar eddy current monitoring systems are described in U.S. Pat. Nos. 6,924,641, 7,112,960 and 7,016,795, the entire disclosures of which are incorporated herein by reference.

In some implementations, a polishing apparatus includes additional polishing stations. For example, a polishing apparatus can include two or three polishing stations. For example, the polishing apparatus can include a first polishing station with a first eddy current monitoring system and a second polishing station with a second eddy current monitoring system.

For example, in operation, bulk polishing of the conductive layer on the substrate can be performed at the first polishing station, and polishing can be halted when a target thickness of the conductive layer remains on the substrate. The substrate is then transferred to the second polishing station, and the substrate can be polished until an underlying layer, e.g., a patterned dielectric layer.

Figure 2:
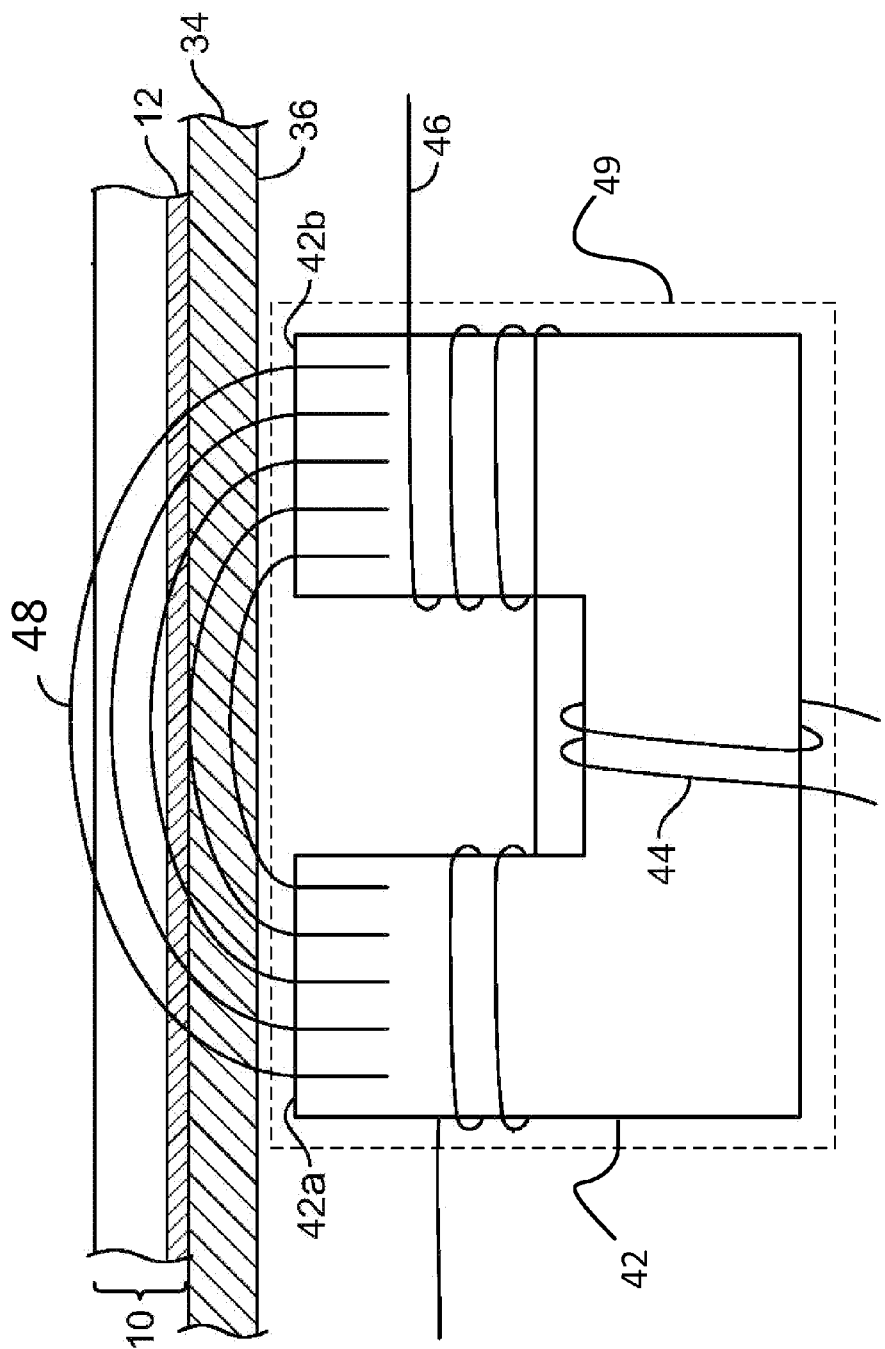
FIG. 2 illustrates a cross-sectional view of an example magnetic field generated by eddy current sensor.

FIG. 2 illustrates a cross sectional view of an example magnetic field 48 generated by an eddy current sensor 49. The eddy current sensor 49 can be positioned at least partially in the recess 26 (see FIG. 1). In some implementations, the eddy current sensor 49 includes a core 42 having two poles 42a and 42b and a drive coil 44. The magnetic core 42 can receive an AC current in the drive coil 44 and can generate a magnetic field 48 between the poles 42a and 42b. The generated magnetic field 48 can extend through the thin pad section 36 and into the substrate 10. A sense coil 46 generates a signal that depends on the eddy current induced in a conductive layer 12 of the substrate 10.

Figure 3:
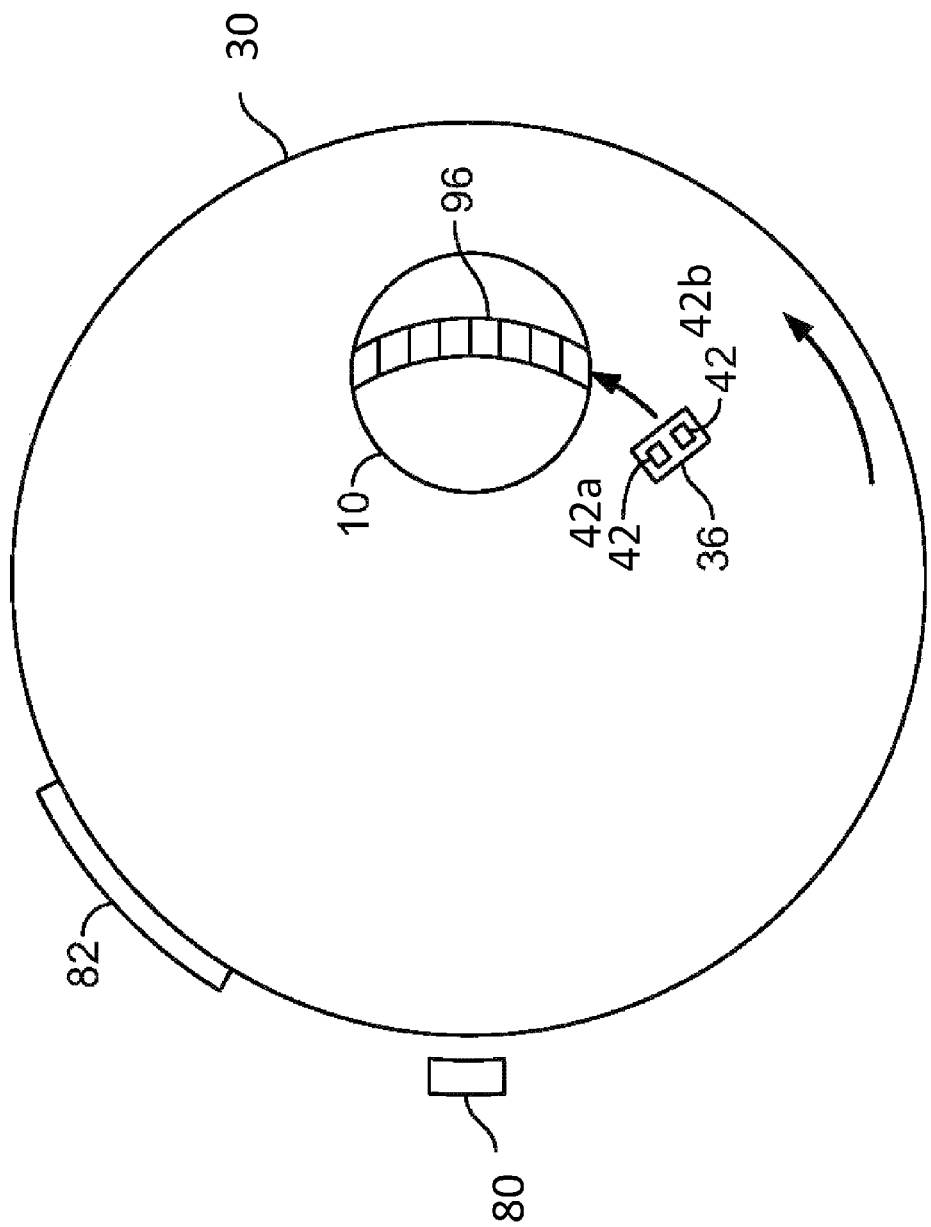
FIG. 3 illustrates a top view of an example chemical mechanical polishing station showing a path of a sensor scan across a wafer.

FIG. 3 illustrates a top view of the platen 24. As the platen 24 rotates, the sensor 49 sweeps below the substrate 10. By sampling the signal from the sensor at a particular frequency, the sensor 49 generates measurements at a sequence of sampling zones 96 across the substrate 10. For each sweep, measurements at one or more of the sampling zones 96 can be selected or combined. Thus, over multiple sweeps, the selected or combined measurements provide the time-varying sequence of values. In addition, off-wafer measurements may be performed at the locations where the sensor 49 is not positioned under the substrate 10.

Referring back to FIGS. 1 and 2, in operation, an oscillator 50 is coupled to drive coil 44 and controls drive coil 44 to generate an oscillating magnetic field 48 that extends through the body of the core 42 and into the gap between the two magnetic poles 42a and 42b of the core 42. At least a portion of magnetic field 48 extends through the thin pad section 36 of the polishing pad 30 and into substrate 10.

If a conductive layer 12, e.g., a metal layer, is present on the substrate 10, the oscillating magnetic field 48 can generate eddy currents in the conductive layer. The generated eddy currents can be detected by the sense coil 46.

Figure 4:
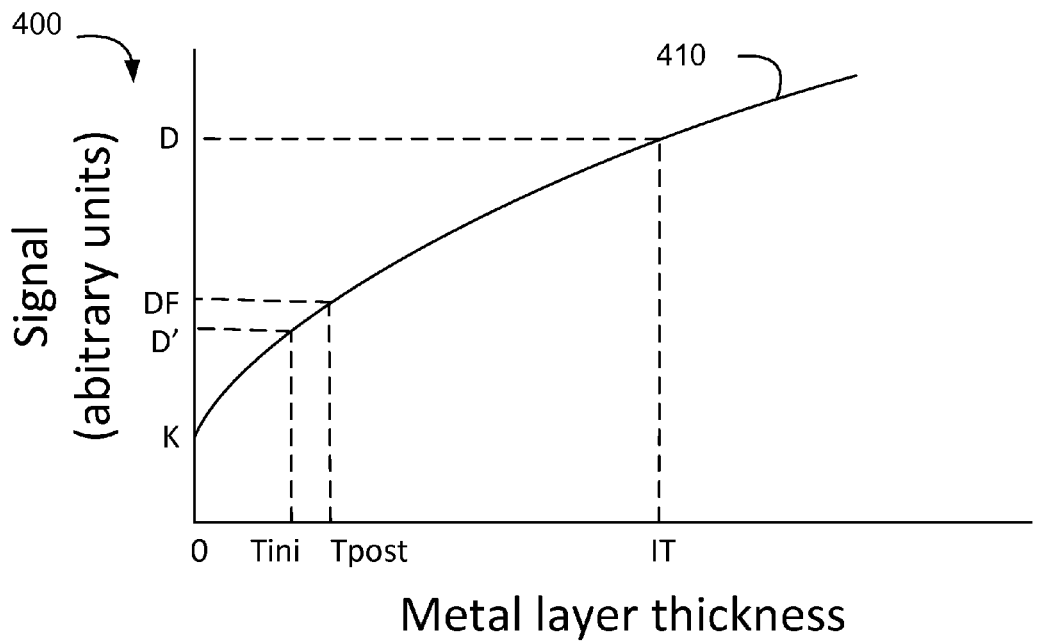
FIG. 4 illustrates a graph of an example eddy current phase signal as a function of conductive layer thickness

As the polishing progresses, material is removed from the conductive layer 12, making the conductive layer 12 thinner and thus increasing the resistance of the conductive layer 12. Therefore, the eddy current induced in the layer 12 changes as the polishing progresses. Consequently, the signal from the eddy current sensor changes as the conductive layer 12 is polished. FIG. 4 shows a graph 400 that illustrates a relationship between conductive layer thickness and the signal from the eddy current monitoring system 40.

In some implementations, the eddy current monitoring system 40 outputs a signal that is proportional to the amplitude of the current flowing in the sense coil 46. In some implementations, the eddy current monitoring system 40 outputs a signal that is proportional to the phase difference between the current flowing in the drive coil 44 and the current flowing in the sense coil 46.

The polishing station 22 can also include a position sensor 80, such as an optical interrupter, to sense when the eddy current sensor 49 is underneath the substrate 10 and when the eddy current sensor 49 is off the substrate. For example, the position sensor 80 can be mounted at a fixed location opposite the carrier head 70. A flag 82 can be attached to the periphery of the platen 24. The point of attachment and length of the flag 82 is selected so that it can signal the position sensor 80 when the core 42 sweeps underneath the substrate 10.

Alternately, the polishing station 22 can include an encoder to determine the angular position of the platen 24. The eddy current sensor can sweep underneath the substrate with each rotation of the platen.

In operation, the polishing station 22 uses the monitoring system 40 to determine when the bulk of the filler layer has been removed and/or an underlying stop layer has been exposed. The in-situ monitoring system 40 can be used to determine the amount of material removed from the surface of the substrate.

Returning back to FIGS. 1 and 3, a general purpose programmable digital computer 90 can be connected to a sensing circuitry 94 that can receive the eddy current signals. Computer 90 can be programmed to sample the eddy current signal when the substrate generally overlies the eddy current sensor 49, to store the sampled signals, and to apply the endpoint detection logic to the stored signals and detect a polishing endpoint and/or to calculate adjustments to the polishing parameters, e.g., changes to the pressure applied by the carrier head, to improve polishing uniformity. Possible endpoint criteria for the detector logic include local minima or maxima, changes in slope, threshold values in amplitude or slope, or combinations thereof.

Components of the eddy current monitoring system other than the coils and core, e.g., the oscillator 50 and sensing circuitry 94, can be located apart from the platen 24, and can be coupled to the components in the platen through a rotary electrical union 29, or can be installed in the platen and communicate with the computer 90 outside the platen through the rotary electrical union 29.

In addition, computer 90 can also be programmed to measure the eddy current signal from each sweep of the eddy current sensor 49 underneath the substrate at a sampling frequency to generate a sequence of measurements for a plurality of sampling zones 96, to calculate the radial position of each sampling zone, to divide the amplitude measurements into a plurality of radial ranges, to and to use the measurements from one or more radial ranges to determine the polishing endpoint and/or to calculate adjustments to the polishing parameter.

Since the eddy current sensor 49 sweeps underneath the substrate 10 with each rotation of the platen, information on the conductive layer thickness is being accumulated in-situ and on a continuous real-time basis. During polishing, the measurements from the eddy current sensor 49 can be displayed on an output device 92 to permit an operator of the polishing station 22 to visually monitor the progress of the polishing operation. By arranging the measurements into radial ranges, the data on the conductive film thickness of each radial range can be fed into a controller (e.g., computer 90) to adjust the polishing pressure profile applied by a carrier head.

In some implementations, the controller may use the eddy current signals to trigger a change in polishing parameters. For example, the controller may change the slurry composition.

Figure 5:
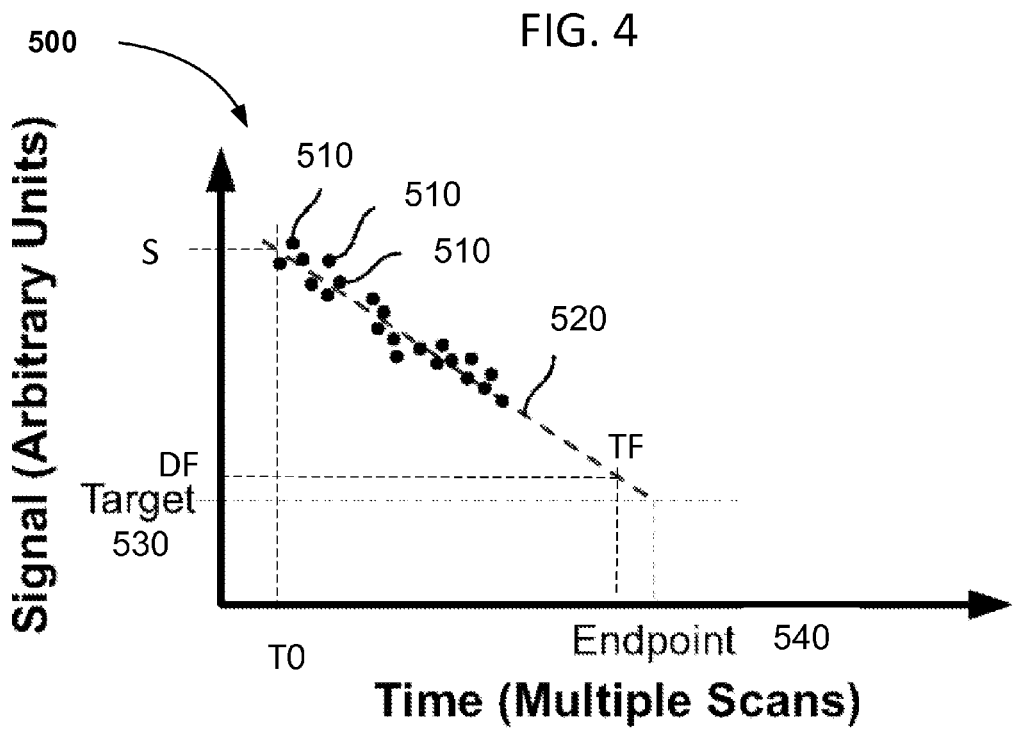
FIG. 5 illustrates a graph of an example trace from the eddy current monitoring system.

FIG. 5 shows a trace 500 generated by an eddy current monitoring system. As noted above, the signal can be sampled to generate one or more measurements 510 for each scan of the sensor across the substrate. Thus, over multiple scans, the eddy current monitoring system generates a sequence of measured values 510. This sequence of measured values can be considered the trace 500. In some implementations, measurements within a scan or from multiple scans can be averaged or filtered, e.g., a running average can be calculated, to generate the measurements 510 of the trace 500.

The sequence of measured values can be used to determine an endpoint or a change to the polishing parameters, e.g., to reduce within-wafer nonuniformity. For example, a function 520 (of measured value versus time) can be fit to the measured values 510. The function 520 can be a polynomial function, e.g., a linear function. An endpoint 540 can be predicted based on a calculated time at which the linear function 520 reaches a target value 530.

As stated above, due to assembly variations and changes over time of environmental or system parameters, the eddy current monitoring system may need calibration. The eddy current monitoring system may be calibrated when the sensor is initially installed on a chemical mechanical polishing station 22. The eddy current monitoring system may automatically be calibrated each time a substrate is loaded for polishing and/or may be calibrated during polishing.

The signal from the eddy current sensor can be affected by drift of environmental parameters, e.g., temperature of the eddy current sensor itself. Drift compensation, e.g., as described in U.S. Pat. No. 7,016,795, can be performed, to compensate for some changes. However, this drift compensation technique might not address various sources of change to the signal, and might not meet increasingly stringent process demands.

A measurement of the substrate from an in-line or stand-alone metrology station can be used in conjunction of measurements from the in-situ eddy current sensor to calibrate a gain of the eddy current monitoring system. For example, a desired starting signal from the in-situ eddy current sensor can determined based on the measurement from the metrology station and a calibration curve. An adjustment for the gain can then be calculated based on a comparison of the expected starting signal to the actual starting signal from the in-situ eddy current sensor.

In some implementations, the calibrations can be performed using equation (1) to correct the gain. In equation (1), N is a correction factor for correcting the gain. D is the desired eddy current signal for a measured conductive layer thickness. S is the starting measured value, i.e., the measured eddy current signal at the beginning of polishing, and K is a constant representing a desired value at an off-wafer location. K can be set to a default value.

$$N=(D-K)/(S-K) \qquad (1)$$

A new gain G' can be calculated based on an old gain G and the correction factor, e.g., G'=G*N.

In some implementations, the correction factor calculated from the values for S and D from one substrate is used to adjust the gain for the in-situ monitoring system for that substrate. For example, the calibration can be represented as $G_n = G_{n-1} * N_n$, where $G_n$ is the gain used for adjusting the $n^{th}$ substrate, $G_{n-1}$ is the gain used for adjusting the $(n-1)^{th}$ substrate, and $N_n$ is the correction factor calculated from the values for S and D determined from data from the $n^{th}$ substrate.

In some implementations, the correction factor calculated from the values for S and D from one substrate is used to adjust the gain for the in-situ monitoring system for a subsequent substrate. For example, the calibration can be represented as $G_{n+1} = G_{n-1} * N_n$, where $G_{n+1}$ is the gain used for adjusting the $(n+1)^{th}$ substrate, $G_{n-1}$ is the gain used for adjusting the $(n-1)^{th}$ substrate, and $N_n$ is the correction factor calculated from the values for S and D determined from data from the $n^{th}$ substrate.

In some implementations, the desired eddy current signal D may be calculated based on a pre-established (i.e., prior to polishing of the substrate) calibration curve relating thickness to eddy current signal. FIG. 4 illustrates an example of a calibration curve 410. In some implementations, the calibration curve is based on eddy current signal values collected from a "golden" polishing station. As a result, ideally all polishing stations would generate the same eddy current signal for the same conductive layer thickness.

Figure 6:
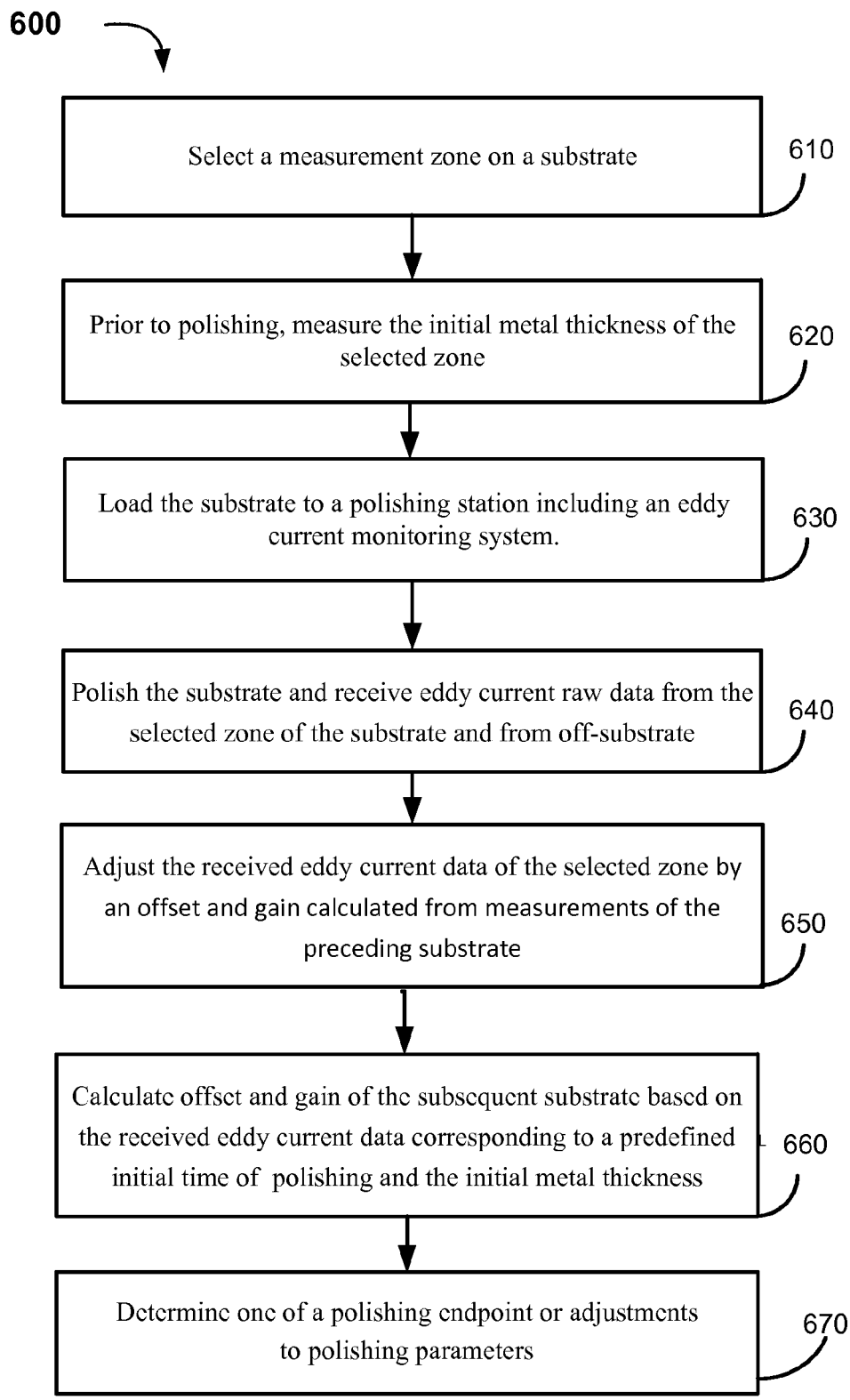
FIG. 6 is a flow graph for the start of a polishing operation of a substrate in a polishing station.

FIG. 6 shows a process 600 for controlling substrate polishing, for example, chemical mechanical polishing. A measurement zone is selected on a substrate (610). The zone can be a radial range of the substrate. For example, a radial range that is empirically determined based on prior measurements to have low axial asymmetry can be selected. For example, the zone can be a radial range that excludes both the center and edge of the substrate. For example, the zone can be a radial range from 20 to 40 mm from the center of the substrate. In some implementations the zone can be selected by a user, e.g., based on input into a graphical user interface.

Prior to polishing, the thickness of an outer conductive layer is measured in the selected zone (620). The outer conductive layer can be a metal layer, such as copper. The measured thickness is stored as the initial conductive layer thickness. This thickness measurement is not performed by the in-situ monitoring system. Rather, the thickness measurement may be performed by an in-line or a stand-alone metrology system suitable for measuring conductive layer thickness, such as an eddy current metrology system, e.g., the iMap™ radial scan system available from Applied Materials.

The substrate is loaded to a polishing station that includes an eddy current monitoring system (630). Loading of the substrate to the polishing station may occur after the thickness of the initial conductive layer is measured. As an example, the substrate may be loaded to the polishing station 22 having an in-situ monitoring system 40.

The substrate is polished and a "raw" eddy current signal from the selected zone of the substrate is received (640). As an example, the raw eddy current signal may be received by the computer 90 of the polishing station 22. As described above, the computer 90 may receive the raw eddy current signal for the entire substrate, and the received signal may be sampled, the position on the substrate for each sampled measurement may be determined, and the sampled measurements may be sorted into a plurality of zones including the selected zone. As noted with respect to FIG. 3, the computer 90 may also receive the raw eddy current signal from off-wafer locations, e.g., when the eddy current sensor is not under the substrate.

The received eddy current data is adjusted by a previously calculated gain and offset (650). For example, an adjusted signal value V' can be calculated from the raw signal value V based on $V' = V * G + K$.

In some implementations, for the $n^{th}$ substrate, the gain is calculated based on data from polishing a preceding $(n-1)^{th}$ substrate. For example, $$V'_n = V_n * G_{n-1} + K \text{ and } G_{n-1} = G_{n-2} * N_{n-1}$$

where $V'_n$ is the adjusted signal value for the $n^{th}$ substrate, $V_n$ is the raw signal value for the $n^{th}$ substrate, $G_{n-1}$ is the gain used for adjusting the $(n-1)^{th}$ substrate, $G_{n-2}$ is the gain used for adjusting the $(n-2)^{th}$ substrate, and $N_{n-1}$ is the correction factor calculated from the values for S and D determined from data from the $(n-1)^{th}$ substrate.

Gain and offset calculations for calibrating the eddy current measurement sensor are described in details with respect to step (670) below.

In some implementations, when polishing a first substrate, for example, the first substrate in a batch or the first substrate after a polishing pad has been replaced, so that prior data is unreliable or unavailable, the gain is simply set as at a default value $G_0$, so that $$V'_1 = V_1 * G_0 + K.$$

A new gain (or an adjustment for the gain) is calculated based on the received eddy current data and the previously measured initial conductive layer thickness (660). As an example the gain calculations can be performed by the computer 90 of the polishing station 22. For example, a correction factor N for the gain can be calculated according to $$N = (D - K)/(S - K).$$

The initial thickness IT of the conductive layer in the selected zone was measured in step 620. The desired value D corresponding to the initial thickness IT can be calculated from the calibration curve 410 (see FIG. 4).

The starting measured value S can be determined from the eddy current data. That is, the eddy current data received during an initial period of polishing should correspond to the initial thickness. For example, once sufficient data has been collected during polishing, a function can be fit to the sequence of adjusted values. The function can be a polynomial function, e.g., a linear function.

A value S at an initial time T0 can be calculated from the fitted function (see FIG. 5). The time T0 is not necessarily the exact start time for the polishing operation, e.g., the time that the substrate is lowered into contact with the polishing pad, but could be several seconds, e.g., 2 or 3 seconds, thereafter. Without being limited to any particular theory, using the time that the substrate is lowered into contact with the polishing pad can give an artificially high signal value since the polishing rate can initially be limited, e.g., due to the fact that the platen is still ramping up to the target rotation rate.

K can be a default value. K can correspond to the value of the calibration curve 410 for zero thickness of the layer. If drift compensation is performed, e.g., as described in U.S. Pat. No. 7,016,795, then the drift compensation can automatically adjust the off-wafer signal back to K at each scan.

A new gain G' can then be calculated from an old gain G as $G' = G * N$.

In some implementations, the new gain is used for a subsequent substrate (i.e., the substrate after the one used to generate the values for S and D). In this case, the gain to be used for the $(n+1)^{th}$ substrate can be expressed as $G_{n+1} = G_{n-1} * N_n$.

In some implementations, after sufficient data is accumulated to determine the starting value S for a current substrate, the new gain is calculated and a net set of data is calculated for the current substrate using the new gain. In this case, the gain to be used for the $n^{th}$ substrate can be expressed as $G_n = G_{n-1} * N_n$.

For example, the new gain can be used for the current substrate when polishing a first substrate, for example, the first substrate in a batch or the first substrate after a polishing pad has been replaced. For the later polished substrates, the new gain can be used for the subsequent substrate.

In some implementations, the sequence of gain values is filtered, e.g., to dampen wafer-to-wafer noise such that gain changes more smoothly, to generate a filtered gain value for a given substrate. This filtered gain value can then be used in place of G in the equations above. For example, the gain can be subject to a recursive notch filter.

In either implementation, the adjusted data is used to determine a polishing endpoint or modify the polishing parameters (670). The adjusted data can represent the thickness of the conductive layer being polished and may be used to trigger a change in polishing parameters. An example of finding a polishing endpoint is described above with reference to FIG. 5.

In some implementations, one or more measurement zones may be selected and the thickness of more than one zone may be used for calibrating the eddy current sensor. In some implementations, the measurement of the initial thickness is performed at one point of the selected zone. In some implementations, the measurement is performed at two or more points of the selected zone and the measured data are averaged.

The resistivity of the conductive layer may change as the temperature of the conductive layer changes. The induced eddy currents and therefore the measured eddy current signals depend on the resistivity of the conductive layer. Polishing a substrate increases the substrate temperature and reduces the induced eddy current signals.

If a substrate is moved from a first in-situ polishing station to a second in-situ polishing station to continue polishing, both polishing stations using eddy current monitory, the temperature variations between the two polishing stations affects the eddy current signals. Temperature compensation can be performed as below:

$$P_{post} = P_{ini}[1 + \text{alpha}(TE_{post} - TE_{ini})] \quad (2)$$

$$T_{ini} = T_{post}[P_{post}/P_{ini}] \quad (3)$$

In the above equations (2) and (3), $P_{post}$ is the resistivity factor of the layer at the second polishing station and $P_{ini}$ is the resistivity factor of the same layer at the first polishing station. $TE_{post}$ is the temperature at the second polishing station and $TE_{ini}$ is the temperature at the first polishing station. The parameter alpha can be calculated empirically and is a value very close to zero, e.g, 0.002 to 0.005, e.g., 0.0032. The parameter alpha can depend on the composition of the layer being polished. In some implementations, the parameter alpha can be selected by user input, e.g., the user can select from a menu listing layer compositions, and the parameter alpha corresponding to the selected layer composition is determined from a look-up table. Equation (5) can be used for thickness correction between two polishing stations having different temperatures.

Figure 7:
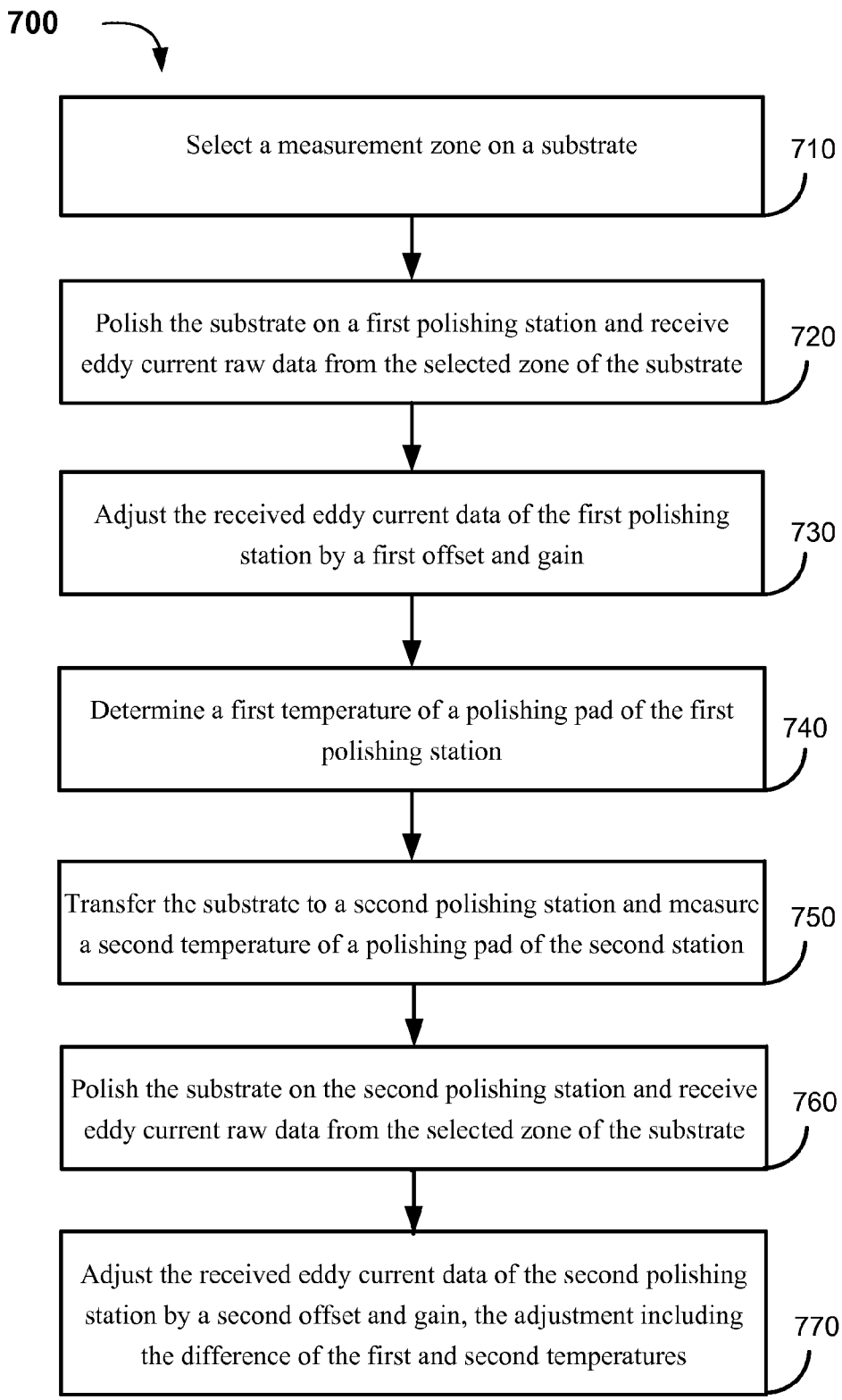
FIG. 7 is a flow graph for transferring a substrate from a first polishing station to a second polishing station.

FIG. 7 shows a process 700 for controlling polishing when transferring a substrate from a first polishing station to a second polishing station. A measurement zone is selected on a substrate (710). As noted above, the zone can be a radial range of the substrate. For example, a radial range that is empirically determined based on prior measurements to have low axial asymmetry can be selected. In some implementations the zone can be selected by a user, e.g., based on input into a graphical user interface.

The substrate is polished at a first polishing station and a "raw" eddy current raw signal from the selected zone of the substrate is received (720). As an example, the eddy current signal may be received by the computer 90 of the polishing station 22. As described above, the computer 90 may receive the eddy current signal of the entire substrate and the sampled measurements can be sorted into different zones, including the selected zone.

The received eddy current data of the selected zone of the first polishing station is adjusted by a first gain and offset (730). Gain and offset can be received from a preceding substrate measurement or may be calculated from the eddy current data of the current substrate being polished as described in details with respect to step (670) above. A first function can be fit to the eddy current data collected at the first polishing station. The first function can be a first polynomial function, e.g., a first linear function. In some implementations, for a short period of time (e.g., 10 seconds) after polishing begins the eddy current data may not be reliable and may be discarded.

A first temperature of the polishing process at the first polishing station is determined (740). In some implementations, the first temperature is a temperature of the polishing pad. Alternatively or in combination, the temperature of the substrate being polished may be measured. Contacting sensors and/or non-contacting sensors (e g, infrared sensors) may be used to measure the temperature. The temperature can be measured periodically and/or around the time polishing at the first polishing station is halted.

The substrate is transferred to a second polishing station and a second temperature of the process at the second polishing station is measured (750). In general, the temperature of the same element as the first polishing station can be measured. For example, if the first temperature is a temperature of the polishing pad at the first polishing station, then the second temperature is a temperature of the polishing pad at the second polishing station. Similarly, if the first temperature is a temperature of the substrate at the first polishing station, then the second temperature is a temperature of the substrate at the second polishing station. The temperature can be measured periodically and/or around the time polishing at the second polishing station begins.

Alternatively, rather than measure the second temperature at the second polishing station, the system can simply assume that the substrate is at a default temperature, e.g., room temperature, e.g., 21° C., when polishing begins at the second polishing station.

The substrate is polished at the second polishing station and a raw eddy current signal the selected zone of the substrate is received (760). As an example, the eddy current signal may be received by the computer 90 of the polishing station 22. As described above, the computer 90 may receive the eddy current raw data of the entire substrate and the sampled measurements can be sorted into different zones, including the selected zone. A second function can be fit to the eddy current data collected at the second polishing station. The second function can be a second polynomial function, e.g., a second linear function.

The received eddy current data for the second polishing station is adjusted by a second gain and offset (770). Gain and offset can be received from a preceding substrate measurement or may be calculated from the eddy current data of the current wafer being polished as described in details with respect to step (670) above. In some implementations, as described in equations (2) and (3), the gain can be adjusted to incorporate the difference between the first and the second temperatures.

For example, when switching the substrate from a first polishing station to a second polishing station, a correction factor N for the gain can be calculated according to $$N=(D'-K)/(S'-K)$$

The starting measured value S' at the second polishing station can be determined from the eddy current data collected at the second polishing station. For example, once sufficient data has been collected during polishing at the second polishing station, the second function, e.g., the second linear function, is fit to the sequence of adjusted values. The value S at an initial time T0 at the second polishing station can be calculated from the second fitted function. The time T0 is not necessarily the exact start time for the polishing operation at the second polishing station, e.g., the time that the substrate is lowered into contact with the polishing pad, but could be several seconds, e.g., 2 or 3 seconds, thereafter.

The final thickness $T_{post}$ of the conductive layer in the selected zone at the first polishing station can be determined. In some implementations, the first function is used to calculate a final value DF for the time TF at which polishing was actually stopped at the first polishing station. In some implementations, the final value DF is simply the target value 530. The final thickness $T_{post}$ corresponding to the final value DF can be calculated based on the calibration curve 410 (see FIG. 4).

To perform temperature compensation, an adjusted initial thickness $T_{ini}$ for the second polishing station is calculated based on the final thickness $T_{post}$ and the temperatures at the two polishing stations. For example, the adjusted initial thickness can be calculated according to $T_{ini}=T_{post}(P_{post}/P_{ini})$. The desired value D's corresponding to the adjusted initial thickness $T_{ini}$ can then be calculated from the calibration curve 410 (see FIG. 4). Calculation of the gain can then proceed as discussed above.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Embodiments can be implemented as one or more computer program products, i.e., one or more computer programs tangibly embodied in a non-transitory machine readable storage media, for execution by, or to control the operation of, data processing apparatus, e.g., a programmable processor, a computer, or multiple processors or computers. A number of embodiments of the invention have been described. Nevertheless, it will be understood that various modifications may be made without departing from the spirit and scope of the invention. For example, more or fewer calibration parameters may be used. Additionally, calibration and/or drift compensation methods may be altered. Accordingly, other embodiments are within the scope of the following claims.

What is claimed is:

1. A computer program product, tangibly encoded on a non-transitory computer readable media, comprising instructions to cause a data processing apparatus to:

receive a measurement of an initial thickness of a conductive film on a first substrate prior to polishing the first substrate from an in-line or stand-alone monitoring system;

cause a polishing station to perform polishing of one or more substrates in a polishing system, the one or more substrates including the first substrate;

during polishing of the one or more substrates, monitor the one or more substrates by receiving a first signal from an eddy current monitoring system;

determine a starting value of the first signal for a start of polishing of the first substrate;

determine a gain based on the starting value and the measurement of the initial thickness;

for at least a portion of the first signal collected during polishing of at least one substrate of the one or more substrates, calculate a second signal based on the first signal and the gain; and determine at least one of a polishing endpoint or an adjustment to a polishing parameter for the at least one substrate based on the second signal.

2. The computer program product of claim 1, wherein the instructions to determine the gain comprise instructions to determine a desired value from a calibration function relating thickness to signal strength and the measurement of the initial thickness.

3. The computer program product of claim 2, wherein the instructions to determine the gain comprise instructions to calculate a multiplier N that satisfies $$N = \frac{(D-K)}{(S-K)}$$

where D is the desired value, S is the starting value, and K is a constant representing a value of the calibration function for zero thickness.

4. The computer program product of claim 1, wherein the instructions to determine the starting value comprise instructions to generate a sequence of measured values from the first signal, fit a function to the sequence of measured values, and calculate the starting value as a value of the function at an approximate start time of polishing.

5. The computer program product of claim 1, wherein the instructions to calculate the second signal comprise instructions to multiply by the gain.

6. The computer program product of claim 5, wherein the instructions to calculate the second signal comprise instructions to calculate a second signal V' that satisfies V'=V*G+K where V is the first signal, G is the gain and K is an offset.

7. The computer program product of claim 1, wherein the at least one substrate of the one or more substrates is the first substrate.

8. The computer program product of claim 1, wherein the at least one substrate of the one or more substrates is a second substrate polished subsequent to the first substrate.

9. The computer program product of claim 1, comprising instructions to determine the starting value from a portion of the first signal generated when an eddy current sensor of the eddy current monitoring system is adjacent the substrate.

10. The computer program product of claim 1, comprising instructions to determine a reference value from a portion of the first signal generated when an eddy current sensor of the eddy current monitoring system is not adjacent the substrate.

11. The computer program product of claim 10, further comprising instructions to generate an offset by adjusting the reference value to generate a desired value for zero thickness.

12. The computer program product of claim 3, wherein the instructions to determine the gain comprise instructions to multiply an old gain by N.

13. A polishing system, comprising:
a rotatable platen to support a polishing pad;
a carrier head to hold a first substrate against the polishing pad;
an in-situ eddy current monitoring system including a sensor to generate a first signal depending on a thickness of a conductive layer on the first substrate; and
a controller configured to perform operations comprising
receiving the first signal from the sensor,
determining a starting value of the first signal for a start of polishing of the first substrate;
determining a gain based on the starting value and a measurement of an initial thickness of the conductive layer on first substrate;
for at least a portion of a signal collected during polishing of the first substrate or a subsequent substrate calculating a second signal based on the signal and the gain, and
determining at least one of a polishing endpoint or an adjustment to a polishing parameter for the first substrate or the subsequent substrate based on the second signal.

14. The system of claim 13, wherein the controller is configured to determine a desired value from a calibration function relating thickness to signal strength and the measurement of the initial thickness.

15. The system of claim 13, wherein the controller is configured to determine the gain by calculating a multiplier N according to $$N = \frac{(D-K)}{(S-K)}$$

where D is the desired value, S is the starting value, and K is a constant representing a value of the calibration function for zero thickness.

16. The system of claim 13, wherein the controller is configured to determine the starting value by generating a sequence of measured values from the first signal, fitting a function to the sequence of measured values, and calculating the starting value as a value of the function at an approximate start time of polishing.

* * * * *